(12) United States Patent
Takewaki et al.

(10) Patent No.: US 7,312,535 B2
(45) Date of Patent: Dec. 25, 2007

(54) SEMICONDUCTOR DEVICE HAVING AN ANTI-OXIDIZING LAYER THAT INHIBITS CORROSION OF AN INTERCONNECT LAYER

(75) Inventors: Toshiyuki Takewaki, Kanagawa (JP); Noriaki Oda, Kanagawa (JP); Yorinobu Kunimune, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 10/803,832

(22) Filed: Mar. 18, 2004

(65) Prior Publication Data

US 2004/0188851 A1   Sep. 30, 2004

(30) Foreign Application Priority Data

Mar. 26, 2003   (JP)   ............... 2003-084910

(51) Int. Cl.
 *H01L 23/48*   (2006.01)
(52) U.S. Cl. ........................ 257/786; 257/737
(58) Field of Classification Search ........ 257/737–741, 257/751, 787, 786
See application file for complete search history.

(56) References Cited

U.S. PATENT DOCUMENTS

| | | | | |
|---|---|---|---|---|
| 5,134,460 A * | 7/1992 | Brady et al. | ................. | 257/737 |
| 5,920,794 A * | 7/1999 | Hong | ...................... | 438/654 |
| 6,028,359 A * | 2/2000 | Merchant et al. | ........... | 257/750 |
| 6,426,281 B1 * | 7/2002 | Lin et al. | .................... | 438/612 |
| 6,545,355 B2 * | 4/2003 | Yanagida | .................... | 257/738 |
| 6,617,687 B2 * | 9/2003 | Akram et al. | ............... | 257/737 |
| 6,649,961 B2 * | 11/2003 | Estacio et al. | ............... | 257/296 |
| 6,777,811 B2 * | 8/2004 | Harada | ........................ | 257/762 |
| 2002/0000665 A1 * | 1/2002 | Barr et al. | ................... | 257/758 |
| 2002/0121692 A1 * | 9/2002 | Lee et al. | .................... | 257/737 |
| 2002/0121709 A1 * | 9/2002 | Matsuki et al. | ............. | 257/786 |
| 2003/0025202 A1 * | 2/2003 | Mikagi et al. | .............. | 257/737 |
| 2003/0052414 A1 * | 3/2003 | Cowens et al. | ............. | 257/778 |
| 2003/0189248 A1 * | 10/2003 | Estacio et al. | ............... | 257/737 |
| 2003/0189261 A1 * | 10/2003 | Tong et al. | .................. | 257/780 |
| 2003/0219966 A1 * | 11/2003 | Jin et al. | ..................... | 438/612 |
| 2004/0124532 A1 * | 7/2004 | Harada | ........................ | 257/751 |

FOREIGN PATENT DOCUMENTS

JP   2000-091341   3/2000
JP   2001-015516   1/2001

\* cited by examiner

*Primary Examiner*—Kenneth Parker
*Assistant Examiner*—Mohammad Timor Karimy
(74) *Attorney, Agent, or Firm*—Muirhead and Saturnelli, LLC

(57) ABSTRACT

The objects of the present invention is to improve the impact resistance of the semiconductor device against the impact from the top surface direction, to improve the corrosion resistance of the surface of the top layer interconnect, to inhibit the crack occurred in the upper layer of the interconnect layer when the surface of the electrode pad is poked with the probe during the non-defective/defective screening, and to prevent the corrosion of the interconnect layer when the surface of electrode pad is poked with the probe during the non-defective/defective screening. A Ti film 116, a TiN film 115 and a pad metal film 117 are formed in this sequence on the upper surface of a Cu interconnect 112. The thermal annealing process is conducted within an inert gas atmosphere to form a Ti—Cu layer 113, and thereafter a polyimide film 118 is formed, and then a cover through hole is provided thereon to expose the surface of the pad metal film 117, and finally a solder ball 120 is joined thereto.

14 Claims, 11 Drawing Sheets

124

127

SEMICONDUCTOR DEVICE HAVING AN ANTI-OXIDIZING LAYER THAT INHIBITS CORROSION OF AN INTERCONNECT LAYER

This application is based on the Japanese Patent Application No. 2003-084,910, the content of which is incorporated hereinto by reference.

BACKGROUND OF THE INVENTION

1. Field of the Invention

The present invention relates to a semiconductor device having an electrode pad and manufacturing method thereof.

2. Description of the Related Art

In semiconductor device, an electrode pad for ensuring the electrical connection to the external may be formed on the top layer interconnect of the interconnect structure patterned on semiconductor substrate. An example of a method for manufacturing a semiconductor device having the electrode pad will be described as follows.

FIGS. 10A to 10D and FIGS. 11A and 11B are cross sectional views showing process steps for manufacturing a conventional semiconductor device. FIGS. 10A to 10D and FIGS. 11A and 11B are schematic diagrams for the use in illustrating the processes, and thickness of each layer shown in the figures such as a multilayer film 111 are different from the actual dimension ratio.

First, the multilayer film 111 having a laminated structure of interconnect layers, interlayer insulating films and so on are formed on a silicon substrate 110, as shown in FIG. 10A. A Cu interconnect 112 is formed on the interlayer insulating film disposed as the top layer thereof. Subsequently, an interlayer insulating film 114 having a dual layer structure including SiON and $SiO_2$ is formed, and via holes 122 opening from the Cu interconnect 112 is formed (FIG. 10A).

Subsequently, a TiN film 115, a pad metal film 117 and a TiN film 121 are formed in turn on the interlayer insulating film 114, and thereafter, these layers are patterned to a dimension suitable for mounting of the solder ball, and thus the pad electrode is formed (FIG. 10B).

Subsequently, a polyimide film 118 is formed so as to cover the pad metal film 117, and thereafter, the polyimide film 118 is patterned to provide an aperture 119, and thus the pad metal film 117 is partially exposed (FIG. 10C). Thereafter, the TiN film 121 on the bottom of the aperture 119 is removed by wet etch processing to obtain the pad electrode structure shown in FIG. 10D.

As an approach for improving the reliability of thus obtainable pad electrode, the following approaches have conventionally been used.

In JP-A-2001-15,516, a technology of reducing the stress occurred in the bonding process to prevent the deterioration of copper interconnect by forming an Al pad at a position of a passivation insulation film slightly slid from the copper pad position, and by inhibiting the transfer of oxygen into the copper interconnect, is proposed. This configuration corresponds to forming the pad metal film 117 to the position where it is slightly slid from the right overhead of the Cu interconnect 112, by association with FIGS. 10A to 10D.

In addition, in JP-A-2000-91,341, a technology for forming an inert alloy of $CuTi_x$ layer on the surface of the copper bond pad to inhibit the formation of intermetallic compounds thereon, and thus providing the direct bonding of the aluminum or the gold interconnect onto the copper bond pad. This will be described corresponding to the configuration of FIGS. 10A to 10D: a configuration comprising a silicon substrate 110, multi-layer films 111, a Cu interconnect 112 and an interlayer insulating film 114, where a $CuTi_x$ layer is formed on the surface of the Cu interconnect 112, is provided. In the process described in JP-A-2000-91,341, the un-reacted Ti layer is removed to expose $CuTi_x$ layer over the surface of the Cu interconnect 112.

Here, when an inspection of the electrical properties of the semiconductor device formed on a semiconductor wafer is carried out, a manner of conducting the inspection by contacting the waveguide probe onto the electrode pad of the device to be inspected may be adopted. That is, in the process of an actual non-defective/defective screening, the inspections of the properties are conducted by a manner where the pad metal film 117 is poked with a probe under a condition shown in FIG. 10D. In this occasion, since the conventional semiconductor device does not have enough impact resistance, the pad metal film 117 and the TiN film 115 underlying thereof may be peeled off when the surface of the pad electrode is poked with a probe, thereby exposing the Cu interconnect 112.

In the semiconductor device of JP-A-2001-15,516, although a certain level of strength is maintained since the Ti film and the TiN film are formed on the upper surface of the copper interconnect, the upper layer of the copper interconnect is damaged when it is poked with the probe for the non-defective/defective screening, thereby the copper interconnect is exposed.

In this way, when Cu interconnect 112 exposes with the condition of FIG. 10D, the surface of the Cu interconnect 112 that is exposed to oxygen in the atmosphere and water is oxidized and corroded. That is, a film of copper oxide 123 is formed on the surface of the Cu interconnect 112 (FIG. 11A). This may deteriorate the interconnect structure. Thus, it is difficult to inhibit the corrosion of the copper interconnect of the case of being poked with the probe, by only moving the installation position of the Al pad from a right overhead of the interconnect layer.

In addition, the semiconductor device of the JP-A-2000-91,341 has an effect of preventing the corrosion of Cu in a certain level, since the device has the $CuTi_x$ layer on the surface of the copper bond pad. However, since the device does not have enough mechanical strength against the impact, the surface of copper bond pad is damaged when it is poked with the probe in the non-defective/defective screening, and copper is eventually exposed.

Thus, the technology of having only a step of forming the $CuTi_x$ layer on the upper part of the copper bond pad may cause a problem, in which the copper bond pad is damaged when it is poked with the probe and similarly the corrosion occurs therein.

Thus, the conventional semiconductor device does not have enough impact resistance against the impact from the direction of the top surface of the substrate in the process of the non-defective/defective screening. In addition, it is required to have a semiconductor device, which can inhibit causing the corrosion of the exposed surface when the copper interconnect is exposed by the impacts.

SUMMARY OF THE INVENTION

In view of the above situation, the present invention provides a solution to the above-mentioned problems, and it is an object of the present invention to provide a technology of improving the impact resistance of the semiconductor device against the impact from the top surface direction. It is another object of the present invention to provide a technology of improving the corrosion resistance of the surface of the top layer interconnect. It is further object of the present invention to provide a technology of inhibiting the crack occurred in the upper layer of the interconnect layer when the surface of the electrode pad is poked with the probe during the non-defective/defective screening. It is yet other object of the present invention and to provide a technology of preventing the corrosion of the interconnect layer when the surface of electrode pad is poked with the probe during the non-defective/defective screening.

According to the present invention, there is provided a semiconductor device comprising: an interconnect layer provided on a semiconductor substrate; a protective film provided on the interconnect layer; and an electrode pad provided on the protective film, wherein the semiconductor device comprises an anti-oxidizing layer containing a different element which is different from an element contained in the interconnect layer, the anti-oxidizing layer being disposed between the interconnect layer and the protective film.

In the semiconductor device according to the present invention, the electrode pad is thereafter configured to have a solder ball formed on the upper part thereof to provide a bonding pad. Semiconductor device is electrically connected to an external circuit by providing an external electrode structure including the solder ball.

Since the protective film is formed in the upper part of the interconnect layer in the semiconductor device of the present invention, better mechanical strength is obtainable, and the damage by the impact occurred when it is poked with the probe during the non-defective/defective screening can be inhibited. In addition, the oxidation of the interconnect metal is effectively inhibited by the action of the anti-oxidizing layer, even if a part of the interconnect layer is exposed by the contact of the probe. Since the semiconductor device according to the present invention has the anti-oxidizing layer between the interconnect layer and the protective film, even though the upper layer of the interconnect layer is damaged in the case of being poked with the probe and the surface of the interconnect layer is exposed, the different element in an anti-oxidizing layer, which is different from an element contained in the interconnect layer, is oxidized by contacting the atmospheric air. Thus, the chemically stable layer that prevents the corrosion of copper is formed on the surface of the interconnect layer, and thereby inhibiting the deterioration of the semiconductor device.

As described above, the present invention prevents the corrosion of the interconnect layer in the case of being poked with the probe, by providing the synergistic effect of the protective film and the anti-oxidizing layer. The interconnect layer may be, for example, a copper-containing metal.

According to the present invention, there is provided a method for manufacturing a semiconductor device, comprising: forming an interconnect layer on a semiconductor substrate; forming a protective film on the interconnect layer; forming an anti-oxidizing layer between the interconnect layer and the protective film, by thermally diffusing a different element on the surface of the interconnect layer, the different element being an element contained in the protective film and being different from an element contained in the interconnect layer; and providing an electrode pad on the protective film.

Since the method for manufacturing the semiconductor device according to the present invention includes forming the protective film on the interconnect layer, the semiconductor device having better impact resistance in the case of being poked with the probe can also be obtained. Thus, the semiconductor device having a properties of inhibiting the corrosion caused by the oxidation of the interconnect layer can be obtained, even in the case where the damage occurs in the upper layer of the interconnect layer to expose the surface of the interconnect layer. In addition, it is ensured to form the anti-oxidizing layer including a different element, which is different from an element contained in the interconnect layer, between the interconnect layer and the protective film. The anti-oxidizing layer may be a layer which is formed by diffusing the different element onto the surface of the interconnect layer, or a layer which is formed by diffusing an element contained in the interconnect layer onto the surface of the protective film.

According to the present invention, there is provided a method for manufacturing a semiconductor device, comprising: forming an interconnect layer on a semiconductor substrate; irradiating a plasma onto a surface of the interconnect layer to form an anti-oxidizing layer on a surface of the interconnect layer, the plasma containing a different element which is different from an element contained in the interconnect layer; forming a protective film on the interconnect layer; and providing an electrode pad on the protective film.

Since the method for manufacturing-the semiconductor device according to the present invention includes irradiating the plasma containing the different element onto the surface of the interconnect layer, the anti-oxidizing layer is ensured to be formed between the interconnect layer and the protective film. Thus, the corrosion occurred by the oxidation of the interconnect layer can be inhibited, when the surface of the interconnect layer is exposed in the case of being poked with the probe.

The method for manufacturing the semiconductor device according to the present invention may have a configuration, in which forming the interconnect layer may include forming a copper-containing metal layer. Since the method for manufacturing the semiconductor device according to the present invention includes forming the anti-oxidizing layer, the corrosion caused on the surface of the interconnect layer is suitably inhibited when the copper-containing metal layer is selected as the interconnect layer.

The present invention may have another configuration, in which the aforementioned different element is a metal having lower oxidation-reduction potential than that of the metal contained in the aforementioned interconnect layer. Having this configuration, when the upper layer of the interconnect layer is damaged in the case of being poked with a probe so that the surface of the interconnect layer is exposed to and contacts the ambient atmosphere, the different element contained in the anti-oxidizing layer is preferentially oxidized. Thus, the stable layer which can prevent the corrosion of copper is formed on the surface of the interconnect layer, and thus the deterioration of the semiconductor device is inhibited.

The present invention may have another configuration, in which the aforementioned different element may be a group IV element or a group VI element in the long form of the periodic table. For example, the aforementioned different element may be Ti or Si. Having this configuration, when the upper layer of the interconnect layer is damaged in the case of being poked with a probe so that the surface of the interconnect layer is exposed to and contacts the ambient atmosphere, the corrosion of the interconnect layer can be more surely inhibited, since an oxide film of Ti or Si is preferentially formed thereon.

The semiconductor device according to the present invention may have a configuration, where the above-mentioned protective film is a Ti layer or a TiN layer. In addition, the method for manufacturing the semiconductor device according to the present invention may have a configuration, in which forming the protective film includes forming the Ti layer or the TiN layer. Since better mechanical strength of the protective layer is ensured by including the Ti layer or the TiN layer in the protective film, the damage of the interconnect layer caused by being poked with probe can further be inhibited.

The semiconductor device according to the present invention may have a configuration, in which the anti-oxidizing layer is a layer where the upper part of the interconnect layer is modified, and comprises the above-mentioned different element and an element contained in the interconnect layer. Having this configuration, the corrosion of the interconnect layer which occurs by being exposed over the interconnect surface during the non-defective/defective screening inspection can be more surely inhibited.

As described above, the present invention provides the improvement in the impact resistance of the semiconductor device against the impact from the top surface direction. In addition, the present invention provides the improvement in the corrosion resistance of the surface of the top layer interconnect. Further, the present invention provides the inhibition to the cracks on the upper layer of the interconnect layer caused in the case when the surface of the electrode pad is poked with the probe for the non-defective/defective screening process. In addition, the present invention provides the prevention of the corrosion of the interconnect layer caused in the case when the surface of the electrode pad is poked with the probe for the non-defective/defective screening process.

This summary of the invention does not necessarily describe all necessary features so that the invention may also be a sub-combination of these described features.

BRIEF DESCRIPTION OF THE DRAWINGS

The foregoing and other objects, features and advantages will become more apparent through the following description of the preferred embodiments and the accompanying drawings listed hereunder.

DETAILED DESCRIPTION OF THE INVENTION

The invention will now be described based on the preferred embodiments. This does not intend to limit the scope of the present invention, but exemplify the invention.

Preferable embodiments of the pad structure having an anti-oxidizing layer provided on the surface of the top layer-interconnect and a protective layer formed thereon will be described as follows in reference to the annexed figures. Here, in the description of the following embodiments, figures used for illustrating the manufacturing process are schematic diagram, and each thickness of each layer does not necessarily correspond to the actual dimension ratio.

First Embodiment

Figure 1:
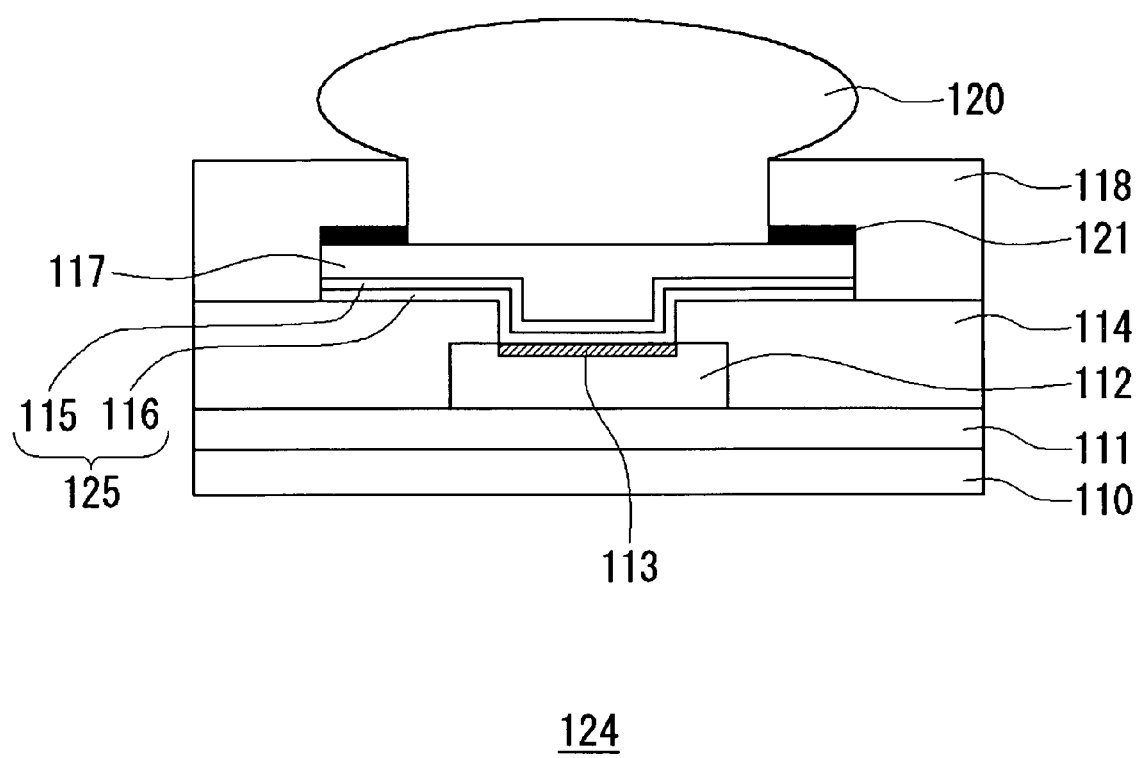
FIG. 1 is a cross sectional view of a pad structure of a preferable embodiment according to the present invention.

FIG. 1 is a schematic diagram showing a pad structure according to the present embodiment. As shown in FIG. 1, a pad structure 124 has TiN/Ti films 125, which have a Ti film 116 and a TiN film 115 formed in this sequence on the upper surface of a Cu interconnect 112, which is formed via a plating process. Since the TiN film 115 has better mechanical strength, TiN/Ti films 125 become a protective film for the Cu interconnect 112 in the case of conducting the non-defective/defective screening test. Thus, the pad structure 124 has better impact resistance in the case of conducting the non-defective/defective screening of the pad structure 124, in which a pad metal film 117 is poked with a probe.

Here, the protective films formed by the laminating manner are referred to as "upper layer/lower layer" in this specification. To take the TiN/Ti films 125 as an example, the Ti film 116 is referred to as a lower layer, and the TiN film 115 is referred to as an upper layer.

Further, the pad structure 124 comprises a Ti—Cu layer 113 formed on the top surface of the Cu interconnect 112. Thus, the corrosion of the Cu interconnect 112 can be inhibited, even if a crack is generated on the TiN/Ti films 125 by being poked with the probe to expose the Cu interconnect 112. This is because Ti is more imperfect metal than Cu, or in other words Ti is a metal having lower oxidation-reduction potential than that of Cu, and when the pad metal film 117 is exposed to the air and contacts oxygen or water, Ti in Ti—Cu layer 113 is oxidized more preferentially than Cu, thereby preventing the oxidation of Cu. In this way, the Ti—Cu layer 113 functions as an anti-oxidizing layer preventing the corrosion of the surface of Cu interconnect 112, and thus providing the Ti—Cu layer 113 inhibits the degradation of the electric contact, which, otherwise, is caused by the corrosion of the surface of the Cu interconnect 112.

The thicknesses of the Cu interconnect 112 and the TiN/Ti films 125 can be designed to predetermined thicknesses, and, for example, the thickness of the Cu interconnect 112 may be designed to about 1.6 µm, the thickness of the Ti film 116 may be about 50 nm, and the thickness of the TiN film 115 may be about 200 nm. Having such configuration, the Ti—Cu layer 113 is preferably formed on the surface of the Cu interconnect 112, while a preferable mechanical strength can be definitely maintained in the TiN/Ti films 125.

In addition, the Ti—Cu layer 113 may be an alloy of Cu and Ti, or may be a chemical compound containing Ti and Cu. Alternatively, the Ti—Cu layer 113 may have a morphology, in which Ti is dispersed onto the boundaries of the grains of the surfaces of the Cu interconnect 112 formed by the plating process. Proportion of Ti and Cu in the Ti—Cu layer 113 can be arbitrarily selected as long as providing an inhibition of the oxidation of Cu. Preferable range thereof may be equal to or less than the solid solubility limit. In addition, the thickness of Ti—Cu layer 113 may be equal to or larger than 10 nm, for example. Having such configuration, the corrosion of Cu can be definitely inhibited. In addition, the thickness may preferably be equal to or larger than 20 nm. Having such configuration, the corrosion of Cu can be more definitely inhibited. In addition, although there is not a particular upper limitation in the thickness of the Ti—Cu layer 113, the thickness of the Ti—Cu layer 113 may be, for example, equal to or less than ½ of the thickness of the Cu interconnect 112. Having such configuration, an increase of the electric resistance can be suitably inhibited.

In the pad structure 124, Al—Cu alloy, for example, can be used as a material for the pad metal film 117. Alternatively, the material may be Al—Ti alloy, Al—W alloy, Al—Mg alloy, Al—Si alloy or Al. Orientation of the (111) plane orientation of Al contained in the pad metal film 117 improves by having a configuration of employing the TiN/Ti films 125 for the protective film and employing Al—Cu alloy for the pad metal film 117. Thus, this provides an improvement in the electric conductivity between the pad metal film 117 and the TiN/Ti films 125, and the electromigration (EM) characteristics are improved when the pad metal film 117 is used for the interconnect.

When Al—Cu alloy is employed, the available ratio of Al and Cu may be within a range of, for example, Al/Cu=from 50/50 to 98/2 (weight ratio) both inclusive. In addition, for example, thickness of the pad metal film 117 may be within a range from about 1 μm to about 2 μm both inclusive.

Further, in pad structure 124, silicon oxide film, silicon oxynitride film, silicon nitride film, or various low dielectric constant-insulation films, for example, may be employed as a material of the interlayer insulating film 114.

Next, the manufacturing process of the pad structure shown in FIG. 1 will be described in reference to FIGS. 2A to 2D. FIGS. 2A to 2D are cross sectional views of the pad structure, showing the process for manufacturing the pad structure according to the present embodiment.

Figure 2A:
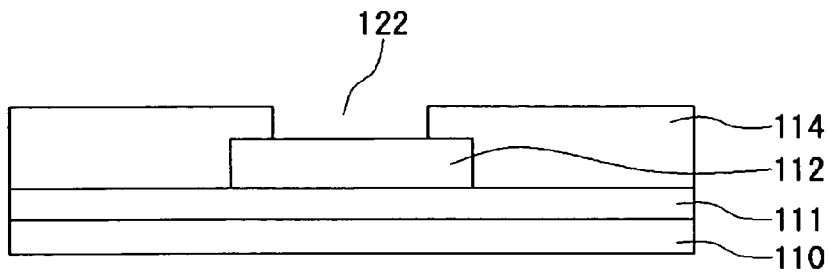
FIGS. 2A to 2D are cross sectional view of a pad structure of a preferable embodiment according to the present invention, showing processing steps for manufacturing thereof.

First, multilayer film 111 having a laminated structure of an interconnect layer, an interlayer insulating film or the like is formed on a silicon substrate 110. A Cu interconnect 112 is formed on the interlayer insulating film of the top layer thereof. Subsequently, an interlayer insulating film 114 having a dual layer structure including SiON and SiO$_2$ is formed. Then, a pad via-photolithography processing and a pad via-etching processing are carried out to form a via hole 122 that opens the pad via (FIG. 2A)

Figure 2B:
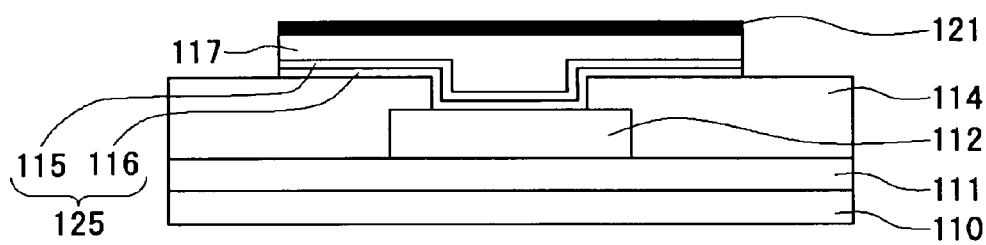

Next, a Ti film 116, a TiN film 115, a pad metal film 117 and a TiN film 121 are formed in this sequence on the interlayer insulating film 114. Here, TiN/Ti films 125 having a multilayer structure of the Ti film 116 and the TiN film 115, for example, are formed via a reactive sputtering. Then, a photolithography of the pad metal film 117 is carried out, and a patterning process is carried out so that the pad electrode having a suitable dimension for mounting a solder ball is formed by a etch processing, and eventually the pad electrode is formed (FIG. 2B).

Figure 2C:
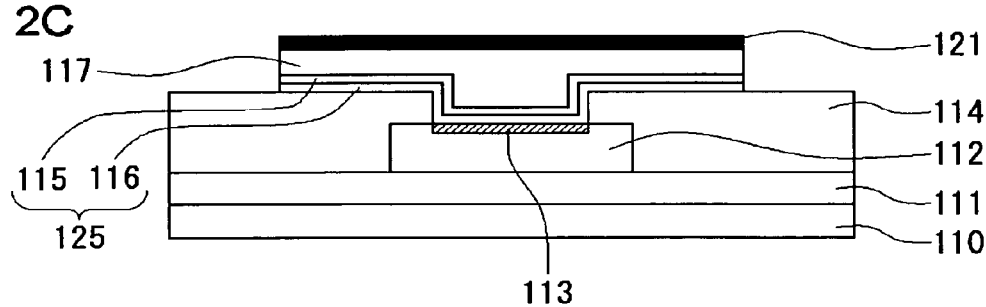

Subsequently, a thermal annealing is conducted within an inert gas atmosphere. Ti originally contained in the Ti film 116 is thermally diffused through the interface with the Cu interconnect 112 into the interior of the Cu interconnect 112 by conducting this process step. Thus, a Ti—Cu layer 113 containing coexisting Ti is formed on the surface of the Cu interconnect 112 (FIG. 2C). The inert gas available in the annealing process may be, for example, H$_2$ gas, N$_2$ gas, Ar gas or the like. In addition, the annealing process condition may be, for example, a furnace annealing with a temperature from 350 degree C. to 450 degree C. both inclusive for not shorter than 30 minutes. Further, although there is no particular upper limitation of the duration time for the furnace annealing, the exemplary duration time for the furnace annealing may be equal to or less than 120 minutes, for example.

In this way, the formation of the Ti—Cu layer 113 is ensured by conducting the annealing processing with a thermal condition that exceeds a thermal condition ordinarily used for the formation of the electrode pad, which will be mentioned later. Since enough annealing effect is not provided in the heating processing that is ordinarily done in the bonding process, it is difficult to obtain such Ti—Cu layer 113 with higher stability.

Concerning the pad structure 124, the Ti—Cu layer 113 is formed by the step of annealing illustrated in FIG. 2C. This effect, which is specific to the annealing, provides the formation of the Ti—Cu layer 113, and thus the prevention of the corrosion of the Cu interconnect 112 is ensured. Further, since the corrosion of the surface of the Cu interconnect 112 is prevented, adhesion between the solder ball 120 and the exposed Cu interconnect 112 is improved, when a damage is occurred in the upper layer of the Cu interconnect 112 by being poked with a probe.

Figure 2D:
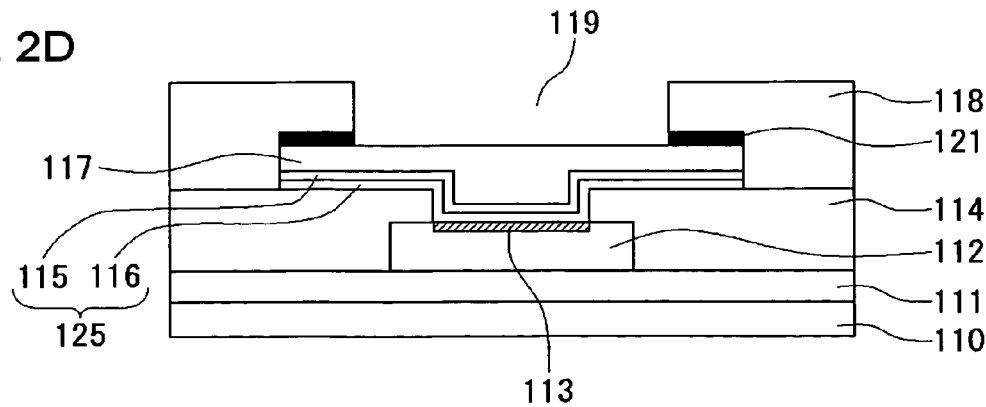

Next to the annealing process, a cover film is formed, and thereafter, a cover photolithography processing is conducted to form a cover through hole. That is, a polyimide film 118 is formed to cover the pad metal film 117, and after that, the polyimide film 118 is patterned to provide an aperture 119, thereby partially exposing the pad metal film 117 (FIG. 2D). Thereafter, the TiN film 121 of the bottom of the aperture 119 is removed by a dry etch processing, and the oxide film of the surface of the pad metal film 117 is removed by using an amine-containing organic solvent to form the pad electrode structure shown in FIG. 2D.

In the present embodiment, the inspections of the electrical characteristics are conducted with this configuration. In the configuration shown in FIG. 2D, the Ti—Cu layer 113 is formed on the surface of the Cu interconnect 112. Thus, even if a crack is generated in the TiN/Ti films 125 or the pad metal film 117 to expose the Cu interconnect 112 when the bonding pad is poked with a probe, Ti in the Ti—Cu layer 113 is preferentially oxidized to form an inactive anti-oxidizing layer, and thus the corrosion of Cu is inhibited.

A non-defective/defective screening inspection is carried out, and thereafter solder adheres into the aperture 119 to form a solder ball 120. As such, the pad structure 124 of FIG. 1 is provided. The bonding condition for adhering the solder to the aperture 119 may be, for example, at a temperature of 380 degree C. for about 5 minutes.

Figure 3:
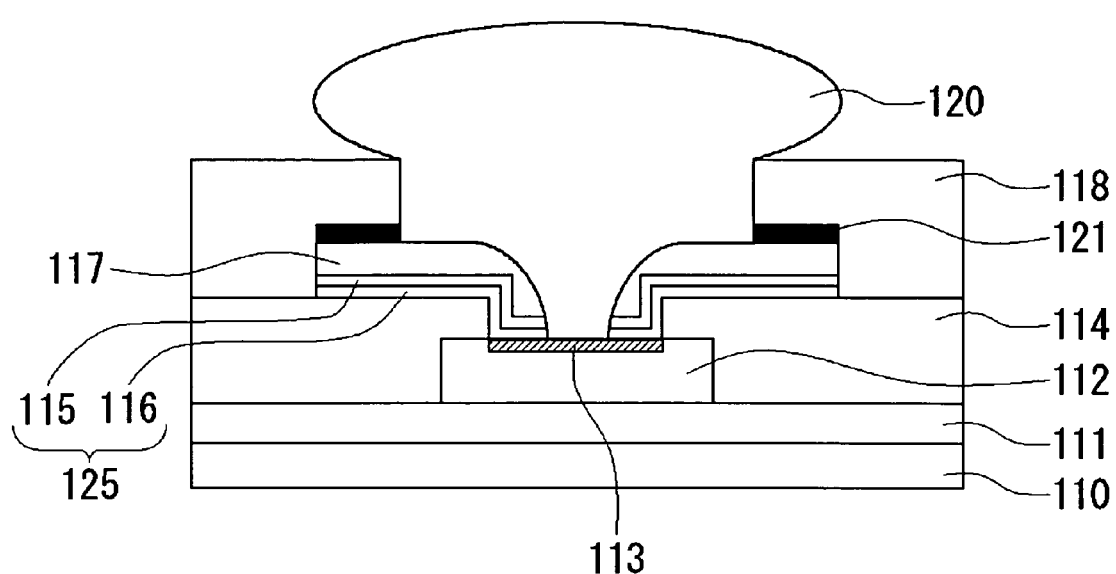
FIG. 3 is a cross sectional view of a pad structure of a preferable embodiment according to the present invention.
Figure 11A:
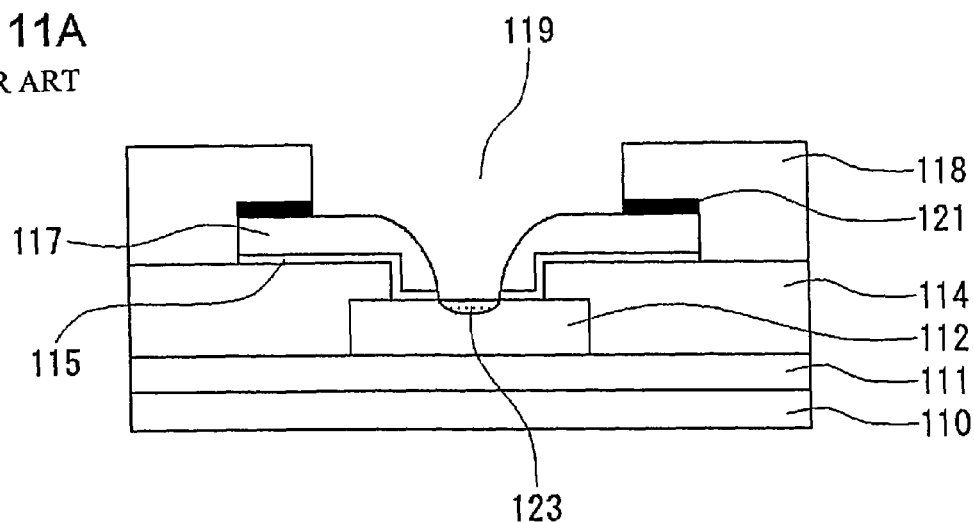
FIGS. 11A and 11B are cross sectional views of the conventional electrode pad, showing process steps for manufacturing a conventional semiconductor device.
Figure 11B:
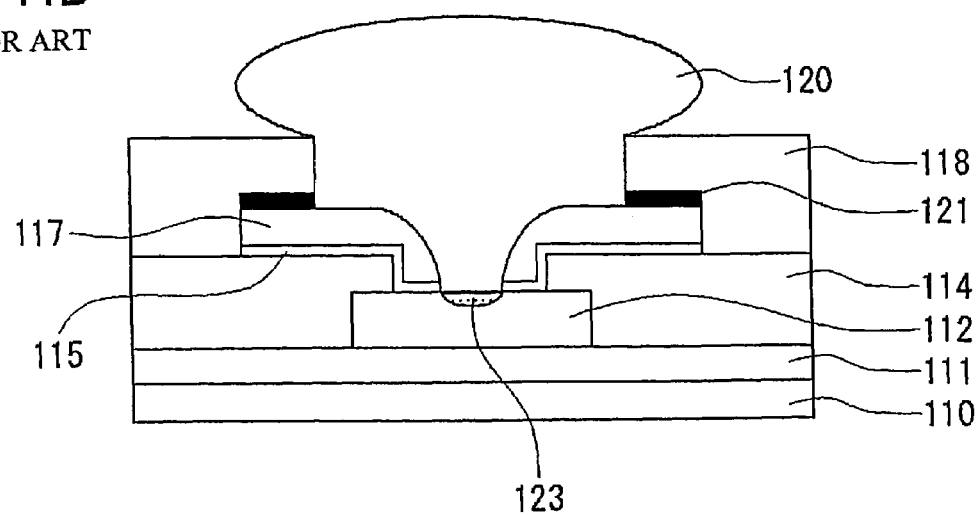

In addition, when the upper layer of the Cu interconnect is damaged in the case of being poked with the probe, the pad structure 124, schematically shown in, for example, FIG. 3, is provided. In the conventional devices, a structure schematically shown in, for example, FIG. 11B, was provided, and the electric contact and the adhesion between the Cu interconnect 112 and the solder ball 120 were deteriorated. On the contrary, in the pad structure shown in FIG. 3, since the oxidation of the surface of the Cu interconnect 112 is prevented by forming the Ti—Cu layer 113 on the surface of the Cu interconnect 112, the adhesion between the Cu interconnect 112 and the solder ball 120 is improved.

Second Embodiment

Although the Ti—Cu layer 113, namely the anti-oxidizing layer, is formed by the thermal diffusion in the first embodiment, the anti-oxidizing layer may alternatively be formed on the surface of the top layer interconnect by irradiating a material containing atoms that compose the anti-oxidizing layer onto the surface of the top layer interconnect.

Figure 4:
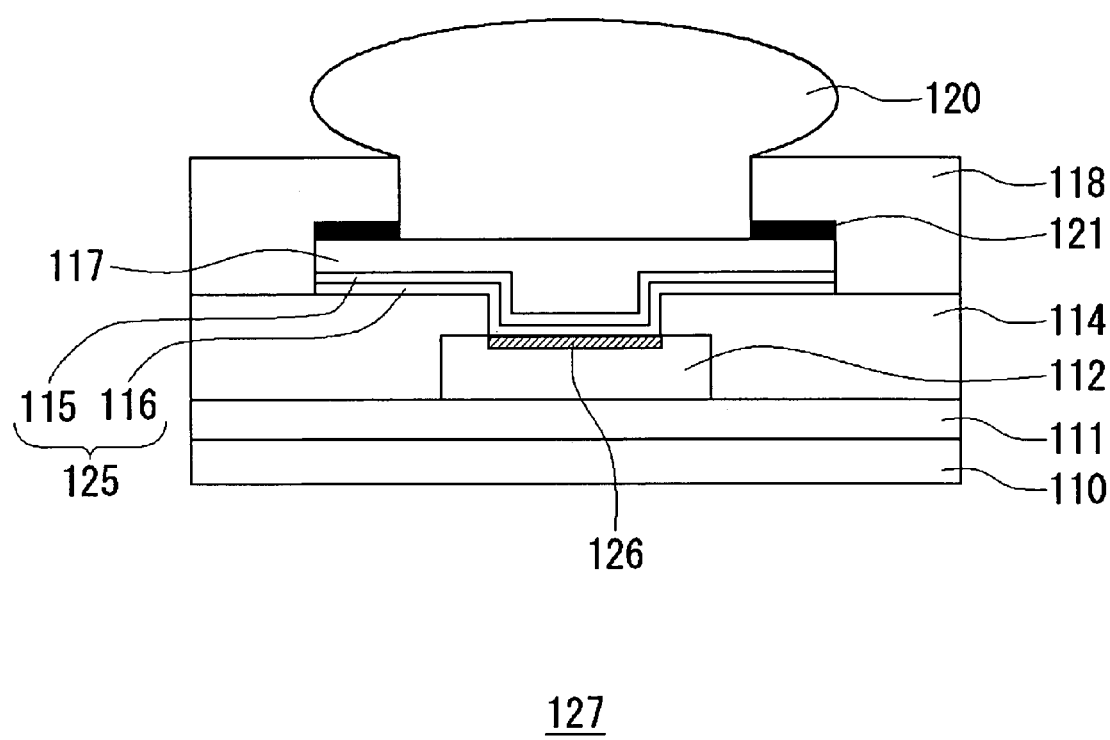
FIG. 4 is a cross sectional view of a pad structure of a preferable embodiment according to the present invention.

FIG. 4 is a cross sectional view showing a pad structure formed in such manner. As for the pad structure 127 shown in FIG. 4, although the basic structure is similar to the pad structure 124 shown in FIG. 1, the component material and the formation method of the anti-oxidizing layer are different. The following description of the pad structure 127 of FIG. 4 will be mainly focused on the different points from the pad structure 124.

In the pad structure 127, a Si—Cu layer 126 is formed on the surface of the Cu interconnect 112. Si is the metal which is more imperfect than Cu, and when the Si—Cu layer 126 is formed on the surface of the Cu interconnect 112, Si preferentially reacts to form oxides when the surface of the Cu interconnect 112 is exposed to the atmosphere, thereby inhibiting the corrosion of Cu.

The Si—Cu layer 126 may be a layer, to which silicidation processing is conducted, or a layer having Si dispersed on the boundary of Cu grain. Proportion of Si and Cu in the Si—Cu layer 126 can be arbitrarily selected as long as providing an inhibition to the oxidation of Cu. Preferable range thereof may be equal to or less than the solid solubility limit. In addition, the thickness of Si—Cu layer 126 may be equal to or larger than 50 nm, for example. Having such configuration, the corrosion of Cu can be definitely inhibited. In addition, the thickness may preferably be equal to or larger than 100 nm. Having such configuration, the corrosion of Cu can be more definitely inhibited. In addition, although there is not a particular upper limitation in the thickness of the Si—Cu layer 126, the thickness of the Si—Cu layer 126 may be, for example, equal to or less than ½ of the thickness of the Cu interconnect 112. Having such configuration, an increase of the electric resistance can be suitably inhibited.

Next, a method for manufacturing a pad structure 127 will be described by illustrating a case, in which a silicidation of the surface of a Cu interconnect 112 is conducted. FIGS. 5A to 5D are cross sectional views of a pad structure 127, showing a manufacturing method of the pad structure 127.

Figure 5A:
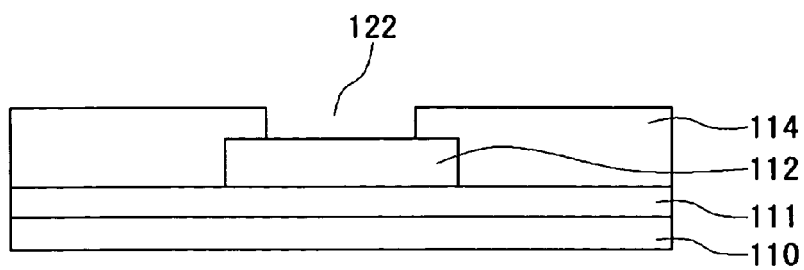
FIGS. 5A to 5D are cross sectional view of a pad structure of a preferable embodiment according to the present invention, showing processing steps for manufacturing thereof.
Figure 5B:
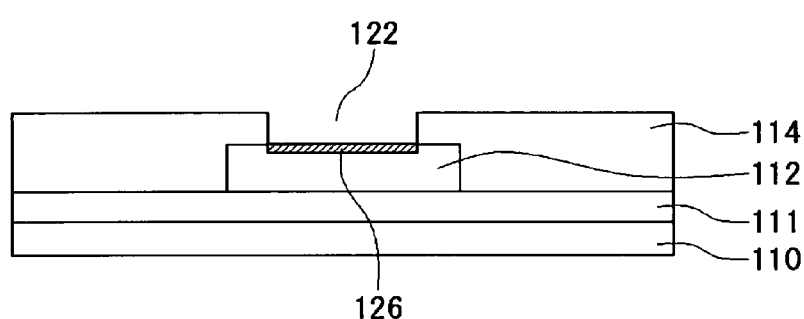
Figure 5C:
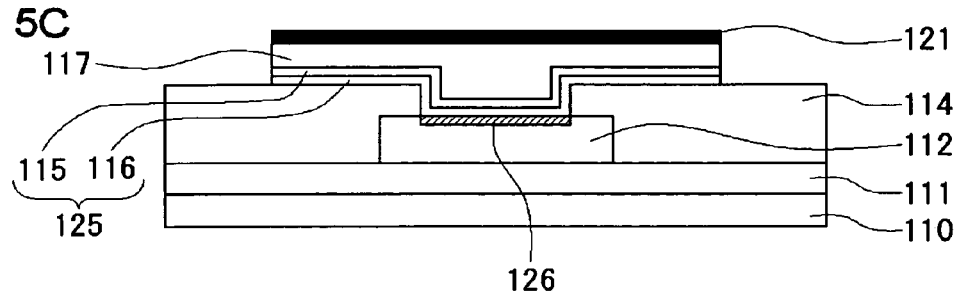
Figure 5D:
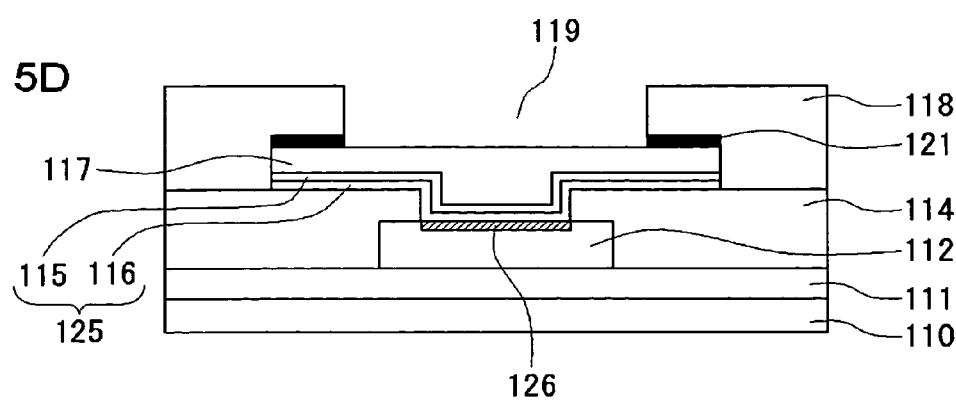

First, similarly as in FIG. 2A, a multi-layer films 111, a Cu interconnect 112, an interlayer insulating film 114 and a via hole 122 are formed on a silicon substrate 110 (FIG. 5A). Next, silicidation of the surface of the Cu interconnect 112 is conducted by a method as mentioned later (FIG. 5B). Next, similarly as shown in FIG. 2B, a Ti film 116, a TiN film 115, a pad metal film 117 and a TiN film 121 are formed in this sequence on the interlayer insulating film 114 (FIG. 5C). Then, a polyimide film 118 is formed similarly as shown in FIG. 2D, and then an aperture 119 is formed to expose a surface of the pad metal film 117, and then the exposed surface is treated with a cleaning solution (FIG. 5D). Then, a solder ball 120 is formed in the aperture 119 similarly as shown in FIG. 1 to provide the pad structure of FIG. 4.

The silicidation of the surface of the Cu interconnect 112 is carried out by a plasma-irradiation. The exemplary process condition may be, for example, under a temperature of 350 degrees and a pressure of 3 Torr, a gaseous mixture containing $SiH_4$ (containing 50 sccm of $SiH_4$ and 5,000 sccm of $N_2$ in volumetric flow rate) is flowed therein for from 20 to 90 seconds both inclusive. Having such process operation, the formation of the Si—Cu layer 126, as the Cu silicide film, on the surface of the Cu interconnect 112 is ensured.

Alternatively, after exposing the Cu interconnect 112, the exposed surface is protected with an anticorrosive agent, and then the silicidation may be carried out. Having such alternative process operation, the silicidation of the surface of the Cu interconnect 112 is ensured.

Figure 6:
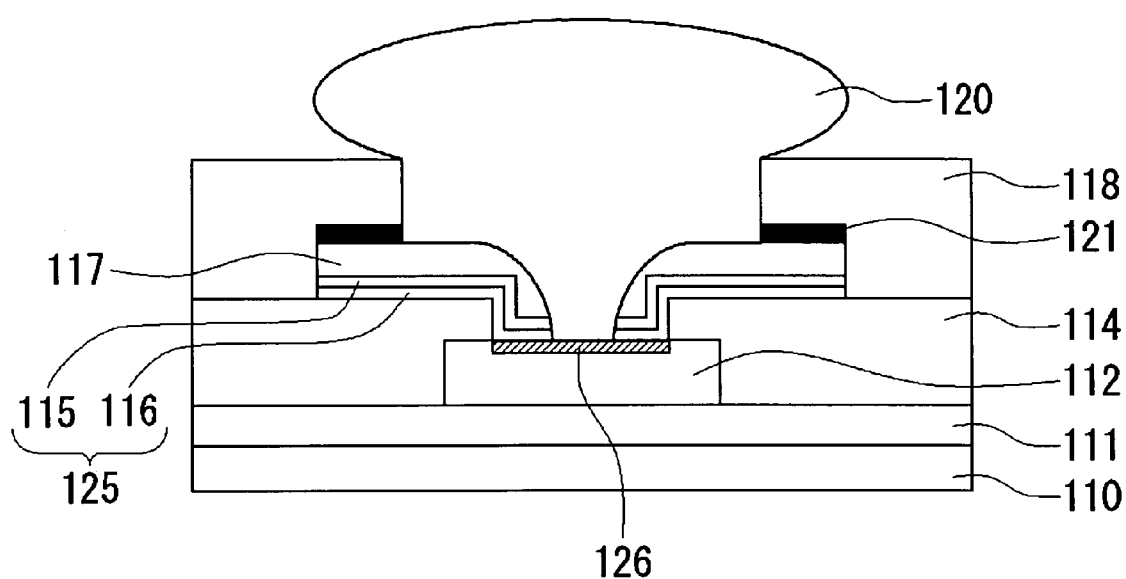
FIG. 6 is a cross sectional view of a pad structure of a preferable embodiment according to the present invention.

In addition, when the upper layer of the Cu interconnect is damaged by being poked with the probe, a pad structure 127 schematically shown in FIG. 6 for example, is obtainable. In the structure shown in FIG. 6, better adhesion between the Cu interconnect 112 and the solder ball 120 may be provided, since a Si—Cu layer 126 is formed on the surface of the Cu interconnect 112 to prevent the oxidation of the surface of the Cu interconnect 112.

In addition, although the pad structure of FIG. 4 employs the TiN/Ti films 125 for the protective film, alternative configuration may have only a TiN film 115 formed as the protective film.

The present invention has been described on the basis of the preferred embodiments as described above. It should be understood by a person having ordinary skills in the art that these embodiments are described for the purpose of the illustrations only and various modification thereof are possible, and further such modifications may be included within a scope of the present invention.

For example, although the embodiments described above employ the Cu interconnect 112 as a top layer interconnect, the materials for the top layer interconnect may be a copper-containing metal such as an alloy with copper and other metal or the like. In addition, metals having lower oxidation-reduction potential than copper, or in other words more imperfect metals, may be employed for the anti-oxidizing layer. As these metals, a group IV element or a group VI element in the long form of the periodic table, for example, may be employed. More specifically, for example, W, Cr, Sn, Sb, Ni, Be, Zr, Hf, Ta, Nb, Co, Pd, Zn, Ge, Al, Mo, V, Mg or the like may be employed, in addition to Ti and Si. When copper or copper-containing metal is employed for the top layer interconnect, the surface thereof is, in general, easily oxidized and corroded. However, since the anti-oxidizing layer of such configuration includes the metal that is more imperfect than copper, the imperfect metal is preferentially oxidized when the surface of the top layer interconnect is exposed to an atmospheric air to prevent the corrosion of the top layer interconnect.

In addition, although the TiN/Ti films 125 is employed for the protective film, the protective film may be a metal, which is more difficult to be oxidized than copper of the lower layer, and easily diffuses into the pad metal film 117. For example, the protective film may be Ta/TaN, W/WN or the like.

In addition, the TiN film 121 may be replaced with a film of other hard or rigid metal, or a metal having higher elastic modulus, and films such as TaN, Ta, WN, W, Mo, TiW or the like may be alternatively employed thereto. Furthermore, polyimide film 118 may be replaced with, for example, a silicon oxide film or a silicon nitride film.

In addition, when pad structure 124 or pad structure 127 is manufactured, the process may include: an oxide film of the surface of the pad metal film 117 is removed by treating the surface of the Cu interconnect 112 with a cleaning solution, and thereafter, a processing for preventing the corrosion of the surface of the pad metal film 117 is conducted. Having such process operation, the corrosion of the surface of the pad metal film 117 can preferably be inhibited.

EXAMPLES

Example

In this example, a structural member that is provided with a copper film having a thickness of 1.6 μm, a TiN layer having a thickness of about 200 nm, and further a Ti layer having a thickness of 50 nm and an Al film having a thickness of about 1.2 μm was formed on a wafer. The copper film corresponds to the above-mentioned interconnect layer, and the Al film corresponds to the above-mentioned pad electrode. The copper film was formed via a plating method, and the Al film was formed via a sputtering process. The TiN layer was formed via a reactive sputtering.

Annealing of the obtained structural member was conducted within $H_2$ atmosphere under the condition at a temperature of 400 degree C. and for 30 minutes. Then, Pt/C/Pt films for facilitating the observation via the transmission electron microscope (TEM) and a protective film were formed in turn. Among the Pt/C/Pt films, Pt under C was formed via CVD, C was formed via an evaporation, and Pt over C was formed via a sputtering.

Furthermore, elemental analysis of each layer in the structure member was conducted by energy dispersion X-rays spectroscopy (EDX).

Comparative Example 1

As a comparison, a structural member that provided with a copper film having a thickness of 1.6 μm, a TiN layer having a thickness of 200 nm and an Al film having a thickness of 1.2 μm was formed on a wafer. Annealing of the obtained structural member was carried out under the similar condition as used in the example, and the TEM observation and the EDX measurement were conducted similarly as in the example.

Comparative Example 2

A structural member having the similar configuration as that of the example was made. Then, the Pt/C/Pt film and the protective film were formed in turn without conducting annealing. Then, the TEM observation and the EDX measurement were conducted similarly as in the example.

Comparative Example 3

A structural member having the similar configuration as that of the comparative example 1 was made. Then, the Pt/C/Pt film and the protective film were formed in turn without conducting annealing. Then, the TEM observation and the EDX measurement were conducted similarly as in the example.

Evaluation of the Results

Figure 7A:
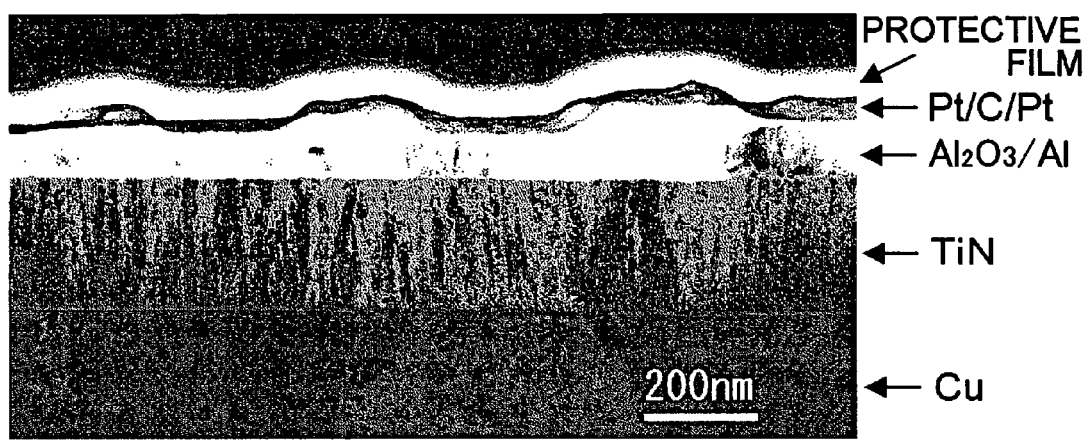
FIGS. 7A and 7B are sectional TEM photographs of the structural member, showing the results obtained in the example.
Figure 7B:
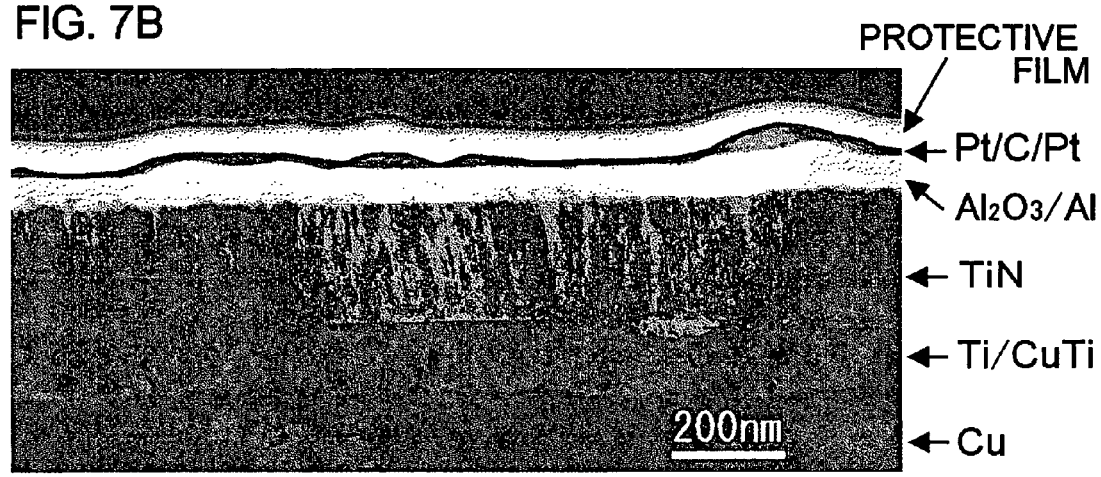

FIGS. 7A and 7B are sectional TEM photographs of the obtained structural member. FIG. 7A shows the cross section of the structural member made in the comparative example 1, and it can be seen that any new layer is not formed on the surface of the Cu interconnect layer. On the other hand, FIG. 7B shows the cross section of the structural member according to the example. The layer having different structure from that of the Cu interconnect layer (indicated as "Ti/CuTi" in the FIG. 7B) was formed on the surface of the Cu interconnect layer, and thus it was confirmed that Ti migrates into the layer along the grain boundary of Cu. The thickness of Cu—Ti layer formed in the structural member of the example was 100 nm.

Figure 8A:
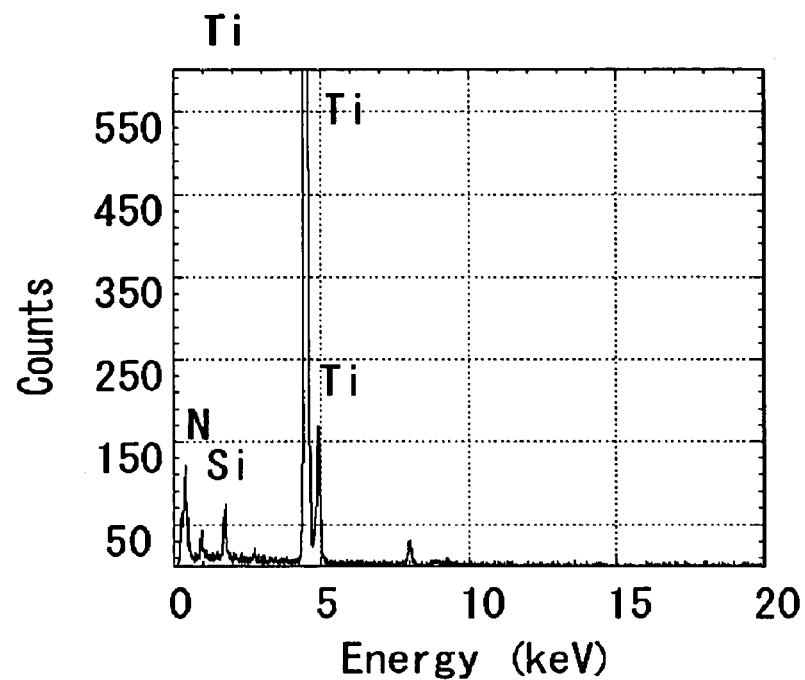
FIGS. 8A, and 8B are spectrums showing the results of the EDX measurements for the structural member of the example.
Figure 8B:
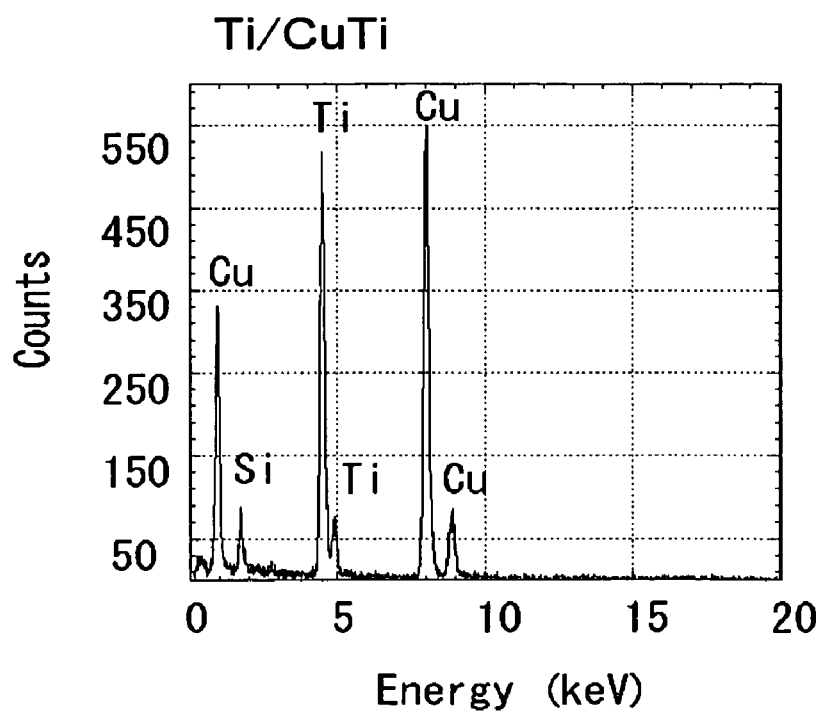
Figure 9C:
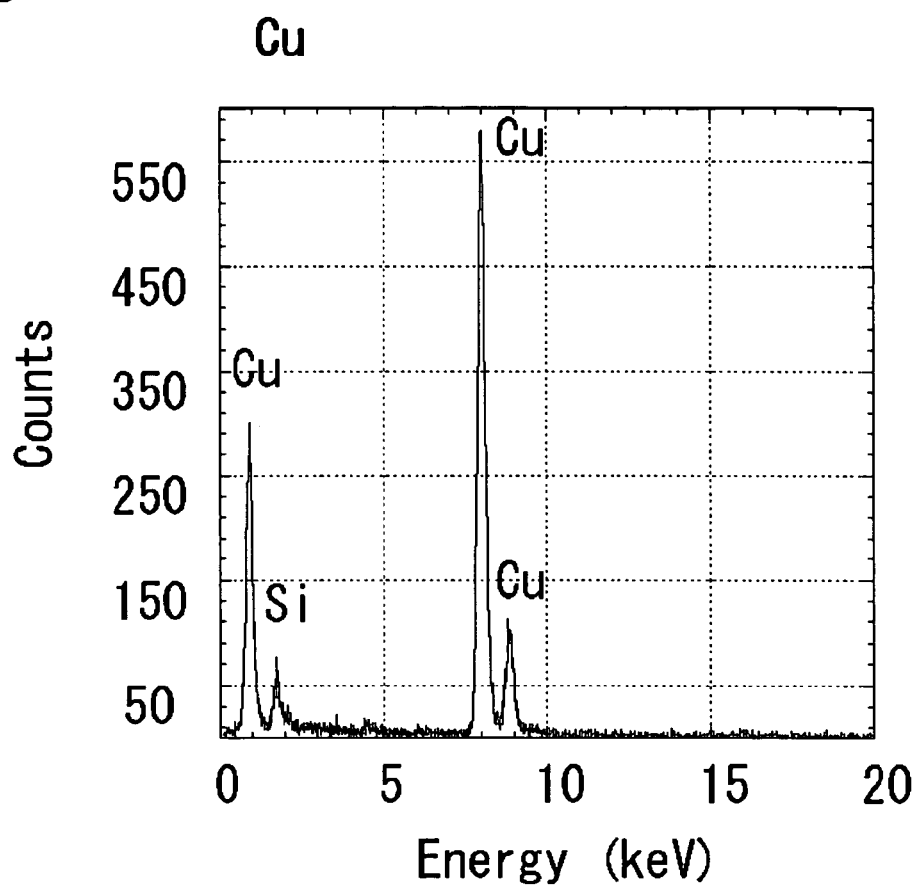
FIG. 9C is a spectrum showing the results of the EDX measurements for the structural member of the example.
Figure 10A:
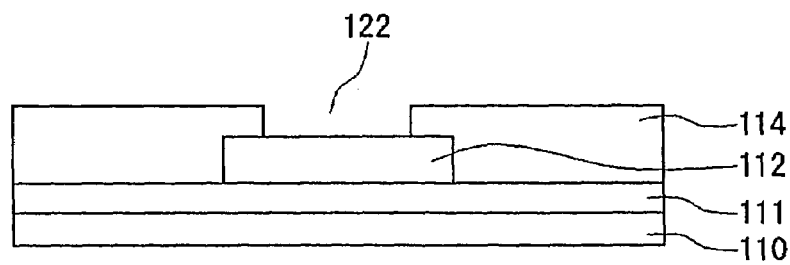
FIGS. 10A to 10D are cross sectional views of the conventional electrode pad, showing process steps for manufacturing a conventional semiconductor device.
Figure 10B:
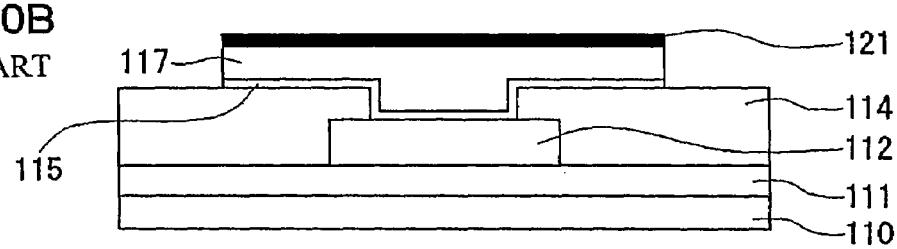
Figure 10C:
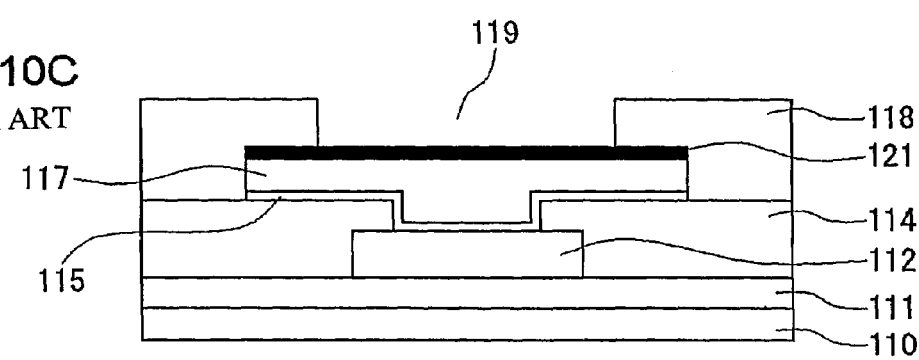
Figure 10D:
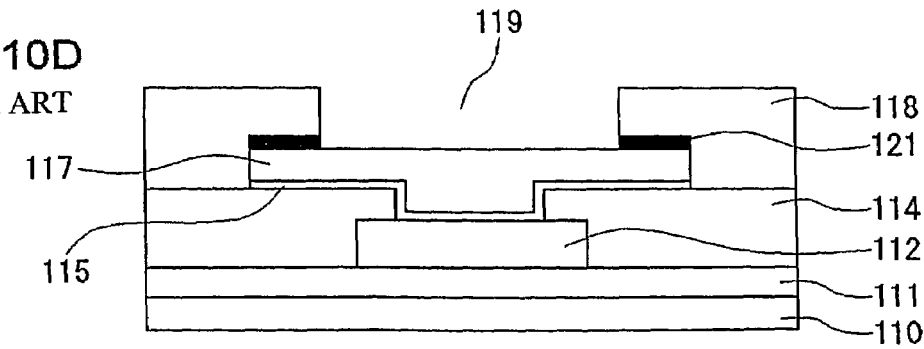

FIG. 8A, FIG. 8B and FIG. 9C are spectrums showing the results of the EDX measurements for the structural member of the example. FIG. 8A shows a measurement result for the TiN layer shown in FIG. 7B, and FIG., 8B shows a measurement result of the Ti/CuTi layer shown in FIG. 7B. Furthermore, FIG. 9C shows a measurement result of the Cu layer shown in FIG. 7B. As can be seen form FIG. 8A, FIG. 8B and FIG. 9C, it was confirmed that the composition of the constituent element of the Ti/CuTi layer was different from that of the TiN layer or that of the Cu layer, and the Ti/CuTi layer included Ti and Cu. In addition, it was also confirmed that the ratio: Ti/Cu=approximately 1/1 (atomic ratio).

In addition, TEM observations and EDX measurements for the structural members of the comparative example 2 and the comparative example 3 were also similarly conducted, and it was confirmed that that no Cu—Ti layer was formed on the surface of the Cu interconnect layer, similarly as in the structural member of the comparative example 1.

It was confirmed from the above-mentioned results that the layer containing Ti and Cu is formed between the Cu interconnect layer and the TiN layer, by forming the Ti layer on the upper part of the Cu interconnect layer, and forming the protective film thereon, and thereafter annealing thereof.

What is claimed is:

1. A semiconductor device, comprising:
    an interconnect layer provided on a semiconductor substrate;
    a protective film provided on said interconnect layer;
    an electrode pad provided on said protective film; and
    an anti-oxidizing layer containing a same element as an element in said interconnect layer that is chemically bonded or alloyed with a different element which is different from said element contained in said interconnect layer, said anti-oxidizing layer being disposed between said interconnect layer and said protective film, wherein said electrode pad is in electrical contact with said interconnect layer and is disposed on said protective film in a position to permit contact by a probe, and wherein said different element of said anti-oxidizing layer is a metal having a lower oxidation-reduction potential than that of said element contained in said interconnect layer, said element being a metal, and said anti-oxidizing layer being disposed between said interconnect layer and said protective film in a position that inhibits corrosion of said interconnect layer when an interface between said electrode pad and said interconnect layer is damaged by said probe, and wherein said different element is a group IV element or a group VI element in long form periodic table.

2. The semiconductor device according to claim 1, wherein said interconnect layer is a copper-containing metal.

3. The semiconductor device according to claim 1, wherein said different element is Ti or Si.

4. A semiconductor device, comprising:
    an interconnect layer provided on a semiconductor substrate;
    a protective film provided on said interconnect layer;
    an electrode pad provided on said protective film; and an anti-oxidizing layer containing a same element as an element in said interconnect layer that is chemically bonded or alloyed with a different element which is different from said element contained in said interconnect layer, said anti-oxidizing layer being disposed between said interconnect layer and said protective film, wherein said electrode pad is in electrical contact with said interconnect layer and is disposed on said protective film in a position to permit contact by a probe, and wherein said different element of said anti-oxidizing layer has a lower oxidation-reduction potential than that of said element contained in said interconnect layer, and said anti-oxidizing layer being disposed between said interconnect layer and said protective film in a position that inhibits corrosion of said interconnect layer when an interface between said electrode pad and said interconnect layer is damaged by said probe, wherein said protective film includes a Ti layer or a TiN layer.

5. A semiconductor device, comprising:

an interconnect layer provided on a semiconductor substrate;

a protective film provided on said interconnect layer;

an electrode pad provided on said protective film; and an anti-oxidizing layer containing a same element as an element in said interconnect layer that is chemically bonded or alloyed with a different element which is different from said element contained in said interconnect layer, said anti-oxidizing layer being disposed between said interconnect layer and said protective film, wherein said electrode pad is in electrical contact with said interconnect layer and is disposed on said protective film in a position to permit contact by a probe, and wherein said different element of said anti-oxidizing layer has a lower oxidation-reduction potential than that of said element contained in said interconnect layer, and said anti-oxidizing layer being disposed between said interconnect layer and said protective film in a position that inhibits corrosion of said interconnect layer when an interface between said electrode pad and said interconnect layer is damaged by said probe, wherein said anti-oxidizing layer is a layer where the upper part of said interconnect layer is modified, and comprises said different element and said same element contained in said interconnect layer.

6. A semiconductor device, comprising:

an interconnect layer provided on a semiconductor substrate;

a protective film provided on said interconnect layer;

an electrode pad provided on said protective film; and an anti-oxidizing layer containing a same element as an element in said interconnect layer that is chemically bonded or alloyed with a different element which is different from said element contained in said interconnect layer, said anti-oxidizing layer being disposed between said interconnect layer and said protective film, wherein said electrode pad is in electrical contact with said interconnect layer and is disposed on said protective film in a position to permit contact by a probe, and said anti-oxidizing layer being disposed between said interconnect layer and said protective film in a position that inhibits corrosion of said interconnect layer when an interface between said electrode pad and said interconnect layer is damaged by said probe, and wherein said protective film includes a Ti layer or a TiN layer.

7. A semiconductor device, comprising:

an interconnect layer provided on a semiconductor substrate;

a protective film provided on said interconnect layer;

an electrode pad provided on said protective film; and an anti-oxidizing layer containing a same element as an element in said interconnect layer that is chemically bonded or alloyed with a different element which is different from said element contained in said interconnect layer, said anti-oxidizing layer being disposed between said interconnect layer and said protective film, wherein said electrode pad is in electrical contact with said interconnect layer and is disposed on said protective film in a position to permit contact by a probe, and said anti-oxidizing layer being disposed between said interconnect layer and said protective film in a position that inhibits corrosion of said interconnect layer when an interface between said electrode pad and said interconnect layer is damaged by said probe, and wherein said anti-oxidizing layer is a layer where the upper part of said interconnect layer is modified, and comprises said different element and said same element contained in said interconnect layer.

8. A semiconductor device, comprising:

an interconnect layer provided over a semiconductor substrate;

an electrically conductive anti-oxidizing layer formed over, and in contact with, a part of said interconnect layer and containing a same element as an element in said interconnect layer that is chemically bonded or alloyed with a different element which is different from said element contained in said interconnect layer, and wherein said different element of said anti-oxidizing layer is a metal having a lower oxidation-reduction potential than that of said element contained in said interconnect layer; and a bonding pad metal film provided over said electrically conductive anti-oxidizing layer to form an electrical conduction with said interconnect layer, wherein said interconnect layer is a copper-containing metal, and said electrically conductive anti-oxidizing layer contains one of Ti—Cu layer and Si—Cu layer.

9. The semiconductor device according to claim 8, further comprising:

an electrically conductive protective film intervening between said electrically conductive anti-oxidizing layer and said bonding pad metal film.

10. The semiconductor device according to claim 9, wherein said electrically conductive protective film contains Ti layer and TiN layer.

11. The semiconductor device according to claim 10, further comprising:

a solder ball adheres to said bonding pad metal film.

12. A semiconductor device, comprising;

an interconnect layer provided over a semiconductor substrate;

an electrically conductive anti-oxidizing layer formed over, and in contact with, a part of said interconnect layer and containing a same element as an element in said interconnect layer that is chemically bonded or alloyed with a different element which is different from said element contained in said interconnect layer, and wherein said different element of said anti-oxidizing layer is a metal having a lower oxidation-reduction potential than that of said element contained in said interconnect layer; and a bonding pad metal film provided over said electrically conductive anti-oxidizing layer to form an electrical conduction with said interconnect layer, wherein said interconnect layer is a copper-containing metal, and said electrically conductive anti-oxidizing layer contains one of Ti—Cu layer and Si—Cu layer.

13. The semiconductor device according to claim 12, further comprising:

an electrically conductive protective film intervening between said electrically conductive anti-oxidizing layer and said bonding pad metal film.

14. The semiconductor device according to claim 13, wherein said electrically conductive protective film contains Ti layer and TiN layer.

* * * * *